(12) United States Patent
Vromans et al.

(10) Patent No.: US 7,897,206 B2
(45) Date of Patent: Mar. 1, 2011

(54) METHOD OF MANUFACTURING AN OPTICAL DATA STORAGE MEDIUM, OPTICAL DATA STORAGE MEDIUM AND APPARATUS FOR PERFORMING SAID METHOD

(75) Inventors: Petrus Helena Gerardus Maria Vromans, Eindhoven (NL); Katerina Musialkova, Eindhoven (NL); Fransiscus Sophia Josepha Petronella Van De Kerkhof, Eindhoven (NL); Erik Jan Prins, Eindhoven (NL); Johannes Cornelis Hendricus Jacobs, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 1127 days.

(21) Appl. No.: 10/541,977

(22) PCT Filed: Nov. 4, 2003

(86) PCT No.: PCT/IB03/05010

§ 371 (c)(1),
(2), (4) Date: Jul. 11, 2005

(87) PCT Pub. No.: WO2004/064055

PCT Pub. Date: Jul. 29, 2004

(65) Prior Publication Data

US 2006/0059501 A1    Mar. 16, 2006

(30) Foreign Application Priority Data

Jan. 14, 2003    (EP) ................... 03075140

(51) Int. Cl.
*B05D 3/02*    (2006.01)
*B05D 3/06*    (2006.01)
*B05D 3/12*    (2006.01)

(52) U.S. Cl. .............. 427/240; 427/508; 427/557; 427/558; 427/595; 427/385.5; 427/425; 118/52; 118/641; 118/58; 118/59; 118/320

(58) Field of Classification Search ............... 427/240, 427/425, 282, 542, 558, 595, 492, 508, 557, 427/385.5; 118/52, 320, 641, 58, 59
See application file for complete search history.

(56) References Cited

U.S. PATENT DOCUMENTS 5,580,607 A * 12/1996 Takekuma et al. .......... 427/240

(Continued)

FOREIGN PATENT DOCUMENTS

EP    1047055    10/2000

(Continued)

*Primary Examiner*—Kristen C Jolley

(57) ABSTRACT

A method of manufacturing an optical data storage medium, comprising at least one substrate (11) and a plurality of layers deposited on the substrate (11) is described. The medium includes at least one of a transparent spacer layer and transparent cover layer (12). The layer (12) is provided by applying a liquid onto the rotating substrate (11) and rotating the substrate (11) further in order to spread out the liquid into a layer substantially uniformly between an inner radius ri and an outer radius ro, and solidifying the liquid layer (12) by means of exposure to UV radiation. After applying the liquid onto the rotating substrate the liquid layer (12) is heated by heating means (14) in such a way that the temperature rise of the liquid layer (12) at ri has a value dTri, while the temperature rise of the liquid layer (12) between ri and ro gradually increases, and the temperature rise of the liquid layer (12) at ro has a value dTro>dTri. In this way the spacer layer or cover layer has a variation in thickness smaller than +/−1 μm, measured over the information storage area. Further a medium manufactured using said method and an apparatus for performing the method are described.

10 Claims, 5 Drawing Sheets

U.S. PATENT DOCUMENTS

| | | | |
|---|---|---|---|
| 6,042,712 A * | 3/2000 | Mathieu | 205/209 |
| 6,242,044 B1 | 6/2001 | Ebert | |
| 2002/0071909 A1 * | 6/2002 | Shida et al. | 427/240 |
| 2002/0124797 A1 * | 9/2002 | Kitano et al. | 118/213 |
| 2003/0145941 A1 | 8/2003 | Hanzawa | |
| 2004/0137751 A1 * | 7/2004 | Ou-Yang | 438/720 |

FOREIGN PATENT DOCUMENTS

| | | | |
|---|---|---|---|
| JP | 59-232339 A | * | 12/1984 |
| JP | 01-107867 A | * | 4/1989 |
| JP | 1173691 A | | 7/1989 |
| JP | 01262968 | | 1/1990 |
| JP | 9167382 A | | 6/1997 |
| JP | 2001-307391 A | * | 11/2001 |
| JP | 2002279707 A | | 9/2002 |
| JP | 2002334490 A | | 11/2002 |
| JP | 2003233936 A | | 8/2003 |
| WO | WO 2004050261 A1 | * | 6/2004 |

* cited by examiner

METHOD OF MANUFACTURING AN OPTICAL DATA STORAGE MEDIUM, OPTICAL DATA STORAGE MEDIUM AND APPARATUS FOR PERFORMING SAID METHOD

The invention relates to a method of manufacturing an optical data storage medium, comprising at least one substrate and a plurality of layers deposited on the substrate, including at least one of a transparent spacer layer and transparent cover layer, which layer is provided by applying a liquid onto the rotating substrate and rotating the substrate further in order to spread out the liquid into a layer substantially uniformly between an inner radius $r_i$ and an outer radius $r_o$, and solidifying the liquid layer by means of exposure to UV radiation.

The invention further relates to an optical data storage medium manufactured using said method.

The invention further relates to an apparatus for performing said method.

An embodiment of such a method is known from European patent application EP-A-1047055. In particular the application of a light transmissive adhesive layer in order to bond cover layers or other layers to each other, to the surface of a substrate and/or to one or more information storage layers is described.

There is a constant drive for obtaining optical storage media suitable for recording and reproducing, which have a storage capacity of several Gigabytes (GB) or larger.

This requirement is met by some Digital Video Disk or sometimes also Digital Versatile Disk formats (DVD). DVD formats can be divided into DVD-ROM that is exclusively for reproduction, DVD-RAM, DVD-RW and DVD+RW, which are also usable for rewritable data storage, and DVD-R, which is recordable once. Presently the DVD formats comprise disks with capacities of 4.7 GB, 8.5 GB, 9.4 GB and 17 GB.

The 8.5 GB and, in particular, the 9.4 GB (DVD-9) and 17 GB (DVD-18) formats exhibit more complicated constructions and usually comprise multiple information storage layers. The 4.7 GB single layer re-writable DVD format is easy to handle comparable, for example, to a conventional compact disk (CD) but offers an insufficient storage capacity for video recording purposes.

A high storage capacity format that recently has been suggested is Digital Video Recordable disk (DVR). Two formats are currently being developed: DVR-red and DVR-blue, the latter also called Blu-Ray Disk (BD), where red and blue refer to the used radiation beam wavelength for recording and reading. This disk overcomes the capacity problem and, in its simplest form, has a single storage layer format which is suitable for high density digital video recording and storage having a capacity up to about 22 GB in the DVR-blue format.

The DVR disk generally comprises a disk-shaped substrate exhibiting on one or both surfaces an information storage layer. The DVR disk further comprises one or more radiation beam transmissive layers. These layers are transmissive to the radiation beam that is used to read from or write into the disk. For example a transmissive cover layer, which is applied on the information storage layer. Generally, for high-density disks, lenses with high numerical aperture (NA), e.g. higher than 0.60, are used for focusing such a radiation beam with a relatively low wavelength. For systems with NA's above 0.60 it becomes increasingly difficult to apply substrate incident recording with substrate thicknesses in the 0.6-1.2 mm range due to decreasing tolerances on e.g. thickness variations and disk tilt. For this reason, when using disks that are recorded and read out with a high NA, focusing onto a recording layer of a first recording stack, is performed from the side opposite from the substrate. Because the first recording layer has to be protected from the environment at least one relatively thin radiation beam transmissive cover layer, e.g. thinner than 0.5 mm, is used through which the radiation beam is focused. Clearly the need for the substrate to be radiation beam transmissive no longer exists and other substrate materials, e.g. metals or alloys thereof, may be used.

In case second or further recording stacks are present, a radiation beam transmissive spacer layer is required between the recording stacks. The second and further recording stacks must be at least partially transparent to the radiation beam wavelength in order to making writing in and reading from the recording layer of the first recording stack possible. The thickness of such spacer layers typically is from the order of tens of micrometers. The radiation beam transmissive layer or layers which are present between the radiation beam source and the recording stack that is most remote from the substrate are normally called cover layers. When prefabricated sheets are used as transmissive layers extra transmissive adhesive layers are required in order to bond cover layers to each other.

In the DVR disk the variation or unevenness of the thickness of the radiation beam transmissive layers over the radial extension of the disk has to be controlled very carefully in order to minimize the variation in the optical path length for the impinging radiation. Especially the optical quality of the radiation beam at the focal point in the DVR-blue version, which uses a radiation beam with a wavelength substantially equal to 405 nm and an NA substantially equal to 0.85, is relatively sensitive to variations in the thickness of the transmissive layers. The total layer thickness has an optimal value in order to obtain minimum optical spherical aberration of the focused radiation beam on, e.g., the first information recording layer. A deviation, e.g. +/−5 µm, from this optimal thickness already introduces a considerable amount of this kind of aberration. Because of this small range it is important that the average thickness of the transmissive layers is equal to or close to its optimal thickness in order to make optimal use of the tolerances of the system and to have a high yield in manufacturing the medium. Assuming that a thickness error is Gaussian distributed around the nominal setting of the thickness, it is clear that the number of manufactured disks which do not comply with the above specification is minimal when the target setting of the nominal thickness during manufacture is substantially equal to the optimal thickness of the cover layer as in the specification of the DVR disk. The nominal thickness of a single layer cover of the DVR disk is 100 µm when the refractive index of the cover layer is n=1.6. The nominal thickness of the cover layer has to be adjusted when using a different refractive index. Since a change in optimal thickness can exceed more than one micron, it is clear from the point of view of yield that even this small change has to be taken into account.

As described earlier, multi-stack disks, e.g. dual-stack, are used to increase the storage capacity of disks. Those disks require a transmissive spacer layer in between the recording stacks. In the case of the dual recording layer DVR disk the sum of the thickness of the spacer layer and the cover layer is chosen to be 100 µm, e.g. a 25 µm spacer layer and a 75 µm cover layer. From EP-A-1047055 it is known to use a polymer layer such as, for example, a polycarbonate (PC) sheet as light-transmissive cover or spacer layer and adhere such layer to the information storage layer by means of a thin, spin-coated layer of a UV curable liquid resin or a pressure sensitive adhesive (PSA). Because the disk now is built up of more than one radiation beam transmissive layer it becomes even more difficult to manufacture the disk which varies within the above specified range. Hence for such a disk it is even more important to set the nominal thicknesses substantially equal to the optimal nominal thicknesses of the cover and spacer layers of the disk.

In order not to depend on measures for compensation of spherical aberration in an optical drive when playing or recording e.g. a BD disk, the thickness variation of the cover layer of a single recording stack disk should be smaller than +/−2 μm. For e.g. a dual recording stack BD disk that variation relates to the spacer layer and cover layer thickness and should be smaller than +/−1 μm for each layer separately. As said before, this puts even more stringent requirements in the tolerance of each separate layer.

A technique currently used by some manufacturers for producing a spacer layer is DVD-bonding. Firstly, spincoating provides an auxiliary substrate or "stamper", e.g. a PC substrate with guide grooves, with a thin layer non-adhesive to the stamper, which is subsequently cured or solidified with ultraviolet (UV) radiation. Then, this auxiliary substrate or "stamper" is glued to a DVD substrate with known DVD bonding techniques, in which technique the liquid glue is spincoated while present between the two substrates and subsequently cured by exposure to UV radiation. The circumferential variation of the total thickness of the cured non-adhesive layer and glue layer cannot be controlled well and the necessary tolerance, e.g. +/−1 μm, is not met. Furthermore, the spin coating application of the non-adhesive layer introduces a so-called edge bead effect at the edge of the disk. This is a peripheral zone of e.g. a few mm with relatively largely increased layer thickness because of surface tension effects at the edge of the disk. An increase of the layer thickness of larger than 5 μm may occur in this zone. Subsequently the stamper is separated from the non-adhesive layer that remains glued to the second substrate. Further process steps follow to finalize the DVD medium, e.g. the application of further recording stacks and a cover layer.

Another method comprises the application of a "PSA-like" material which is UV-cured after being brought in contact with the first DVD substrate under vacuum. This material is usually supplied as a sheet of foil. Thickness variations achieved with this material may be below +/−2 μm. However due to the high material costs such a process is relatively expensive compared to a spincoating process.

When using a known spin coating process the following problems are encountered. Because the substrate usually contains a center hole the liquid to be solidified is dosed in the form of a circular bead around the center hole. This usually results in a liquid layer which after rotation of the substrate yields a liquid layer which shows a radially increasing layer thickness of 15-30% from inner to outer diameter of the liquid layer. The edge bead at the peripheral zone of the substrate may result in an extra layer thickness increase of more than 5 μm, e.g. from radius 55 to 58 mm when using a 120 mm diameter circular substrate. Usually these edge phenomena are not uniformly present around the periphery resulting in additional circumferential variations at the outer periphery area of the substrate. When using spin coating with e.g. the DVD-bonding technique glue which is expelled from between the DVD substrate and the stamper may accumulate at the periphery and leave a residue at the stamper or a burr at the DVD substrate after separating these two. This poses a problem for reuse of the stamper and the burr at the edge of DVD substrate may cause problems in subsequent process steps of manufacture of the optical data storage medium e.g. application of a transparent cover layer.

It is an object of the invention to provide a method of the kind described in the opening paragraph, for manufacturing an optical data storage medium with a spacer layer or cover layer which has a variation in thickness smaller than +/−1 μm, measured over the information storage area.

It is another object of the invention to provide an optical data storage medium with a spacer layer made according to the method of the invention containing embossed information.

It is a further object of the invention to provide an apparatus for performing the said method.

The first object is achieved with a method according to the opening paragraph which is characterized in that:
after applying the liquid onto the rotating substrate, the liquid layer is heated by heating means in such a way that,
the temperature rise of the liquid layer at $r_i$ has a value $\delta T_{ri}$ while,
the temperature rise of the liquid layer between $r_i$ and $r_o$ gradually increases,
the temperature rise of the liquid layer at $r_o$ has a value $\delta T_{ro} > \delta T_{ri}$.

When using this method the viscosity of the liquid layer is decreased according to its temperature rise. This viscosity decrease influences the fluid flow physics of the spin coating process in such a way that the radial liquid layer thickness profile after spincoating is substantially uniform. Fine tuning for better uniformity may be achieved by e.g. changing the rotation frequency of the substrate or by changing the rotation period, although these changes are of secondary effect. In fact the shape of the temperature rise profile is the main factor determining the uniformity of the desired final radial thickness profile. The desired uniformity of the profile is that the radial thickness distribution of the liquid layer after complete substantial solidification does not have a variation of more than +/−1 μm.

Preferably the temperature rise between $r_1$ and $r_0$ has a radial temperature profile with a shape substantially resembling the shape of a radial thickness profile resulting when $\delta T_{ro}$ and $\delta T_{ri}$ would be zero. When using this profile a liquid layer thickness variation of even less than +/−0.5 μm may be achieved.

In an embodiment the heating means comprise an infra red heating device projecting IR radiation onto the substrate in an area with a radius larger than $r_i$ for causing a desired radial temperature profile in the liquid layer. This heating method has the advantage of being relatively easy to implement. Alternatively the heating means comprise a heated chuck on which the substrate is mounted during rotation, said chuck having a heated surface for causing a desired radial temperature profile in the liquid layer or the heating means comprise a directed flow of heated gas emanating from a nozzle.

It is advantageous when a few mm wide outer peripheral zone of the substrate is shielded by a mask in order to prevent exposure of the liquid layer in this zone to UV radiation. After the exposure of the liquid in the exposed portion, the substrate is rotated at a rotation frequency sufficiently high to substantially remove the non exposed liquid in the outer peripheral zone from the substrate. This has the advantage that a possible edge bead (see 12b in FIG. 1) in the outer peripheral zone is removed and that no residues of liquid are left at the outer periphery of either the substrate or a stamper which is used with e.g. the DVD bonding technique as described earlier in which case UV curable glue, which is expelled from between the DVD substrate and the stamper and has accumulated at the periphery and leave a residue at the stamper or a burr at the DVD substrate after separating these two, is removed by this process step. In this way a stamper may be used again more easily. Compare the so-called DVD-18 technique, which is used to produce double sided dual layer DVD read only disks where information is transferred by embossing via a stamper substrate, but which technique requires the removal of excess glue in order to enable a good separation of the stamper substrate and the DVD substrate.

It is especially advantageous when the exposure takes place in an atmosphere containing oxygen and at an exposure intensity leaving a few μm top portion of the liquid layer unsolidified by means of oxygen inhibition. In such a way the top portion of the liquid layer is left substantially unsolidified. This enables the embossing of information, e.g. pregrooves or pits or the inverse, in the top portion of the liquid layer. Small relative variations in the thickness of the top portion, e.g. 0.2 μm, may still occur but are negligible compared to the total thickness of the liquid layer after solidification.

The second object is achieved with an optical data storage medium as described in the second paragraph which is characterized in that a stamper is pressed into the unsolidified top portion of the liquid layer of a spacer layer manufactured using the method of the invention. Subsequently the top portion is solidified by exposure to radiation. The stamper is separated from the top portion of the completely solidified liquid layer. Further layers, e.g. recording stacks and a cover layer, may be provided for finalization of the optical data storage medium. By leaving the top portion of the liquid layer substantially unsolidified information may be embossed without noticably disturbing the total thickness of the spacer.

In a favorable embodiment the stamper is transparent to UV radiation and the top portion is solidified by UV radiation which is projected through the transparent stamper. A transparent stamper has the advantage of enabling a more direct exposure of the top portion of the liquid layer and that a substrate may be used which is not transparent to UV radiation.

The third object is achieved with an apparatus comprising:
means for receiving a substrate and a plurality of layers deposited on the substrate,
means for rotating the substrate,
means for providing at least one of a transparent spacer layer and transparent cover layer, by applying a liquid onto the rotating substrate and rotating the substrate further in order to spread out the liquid into a layer substantially uniformly between an inner radius $r_i$ and an outer radius $r_o$, and
means for heating the liquid layer after applying the liquid onto the rotating substrate in such a way that,
the temperature rise of the liquid layer at $r_i$ has a value $\delta T_{ri}$ while,
the temperature rise of the liquid layer between $r_i$ and $r_o$ gradually increases,
the temperature rise of the liquid layer at $r_o$ has a value $\delta T_{ro} > \delta T_{ri}$.
means for solidifying the liquid layer by exposure to UV radiation directly after the heating step.

In an embodiment the means for heating comprise an infrared heating device projecting IR radiation onto the substrate in an area with a radius larger than $r_i$ for causing a desired radial temperature profile in the liquid layer.

In another embodiment the means for heating comprise a heated chuck on which the substrate is mounted during rotation, said chuck having a heated surface for causing a desired radial temperature profile in the liquid layer.

In another embodiment the means for heating comprise a directed flow of heated gas emanating from a nozzle for causing a desired radial temperature profile in the liquid layer.

Preferably the apparatus has a mask for shielding a few mm wide outer peripheral zone of the substrate in order to prevent exposure of the liquid layer in this zone to UV radiation.

The method of manufacturing the optical data storage medium and the optical data storage medium according to the invention will be elucidated in greater detail with reference to the accompanying drawings, in which FIG. 1 shows a schematic cross-sectional view of a setup to perform an embodiment of the method according to the invention; The dimensions are not drawn to scale;

Figure 1:
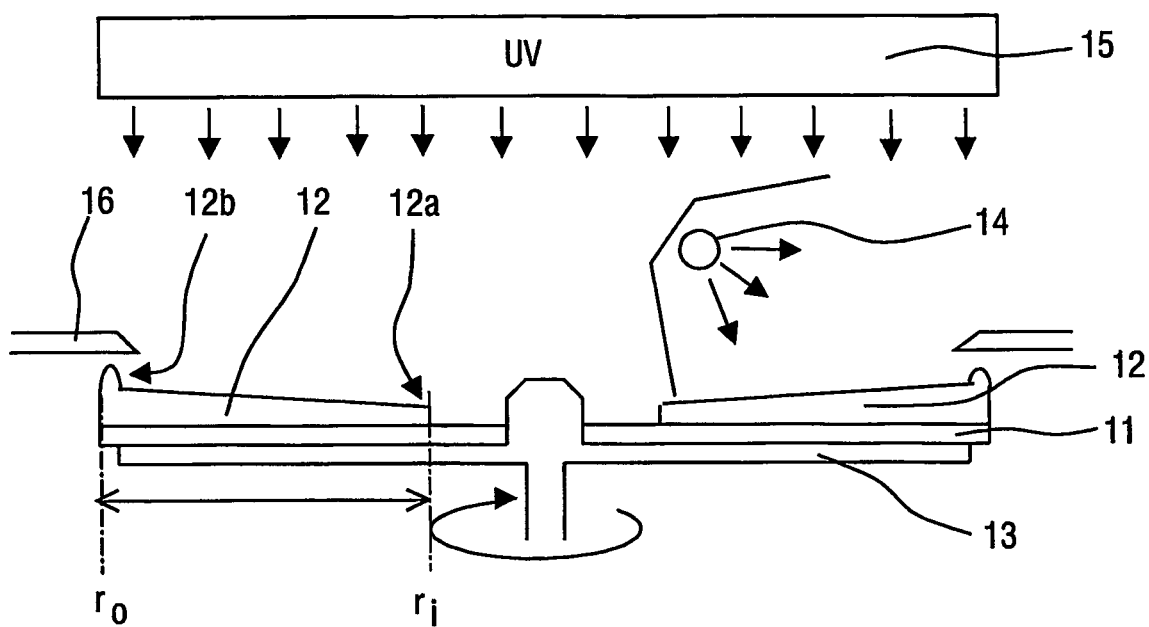
Figure 6:
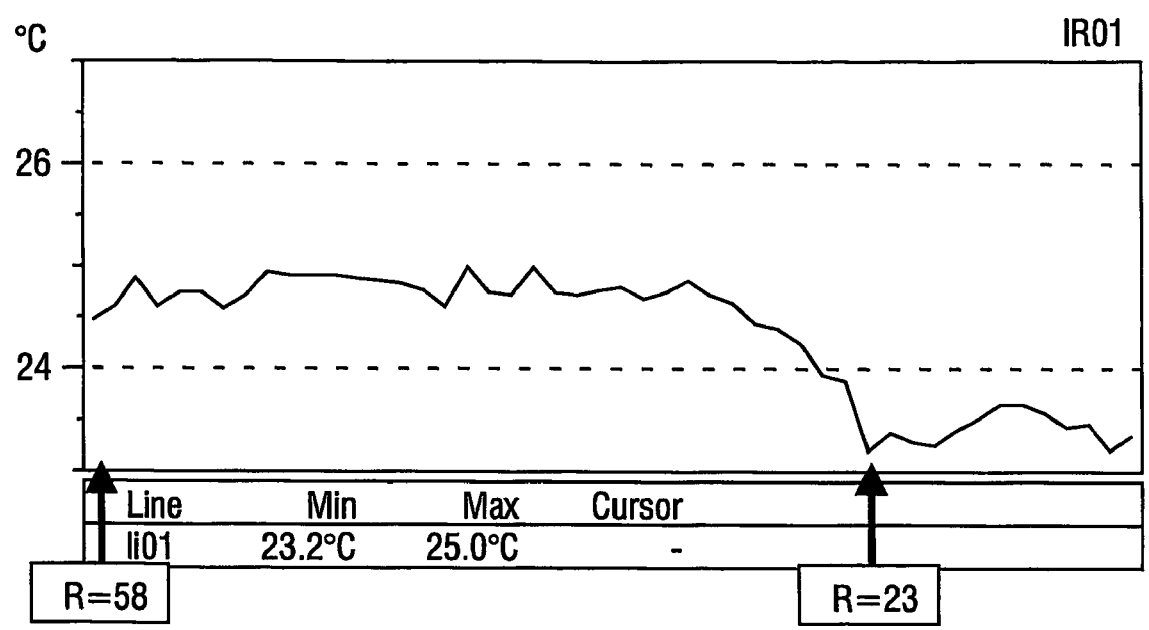

FIG. 6 shows a radial temperature profile of the liquid layer measured a few seconds after the heating step by means of an IR camera In FIG. 1 a setup for performing an embodiment of the method of manufacturing an optical data storage medium is shown. The medium comprises a substrate 11 with a plurality of layers, e.g. a recording stack, which is not drawn. A transparent spacer layer 12 is provided by applying in 6 seconds about 2 grams of a liquid 12 onto the rotating substrate 11 and rotating the substrate 11 further in order to spread out the liquid 12 substantially uniformly between an inner radius of $r_i$=23 mm and an outer radius of $r_o$=57.5 mm. The rotation frequency of the substrate during application is ⅔ Hz and is subsequently ramped up to 50 Hz in about 3 sec and then left another 5 seconds on 50 Hz. The liquid is a UV curable glue provided by Eques having a viscosity of 1000 mPas. When, during the spreading of the liquid, the liquid has reached the outer edge the liquid layer 12 is heated by heating means during about 4 seconds, i.e. in such a way that,
the temperature rise of the liquid layer 12 at $r_i$ has a value $\delta T_{ri}$ while,
the temperature rise of the liquid layer 12 between $r_i$ and $r_o$ gradually increases,
the temperature rise of the liquid layer 12 at $r_o$ has a value $\delta T_{ro} > \delta T_{ri}$.

Figure 3:
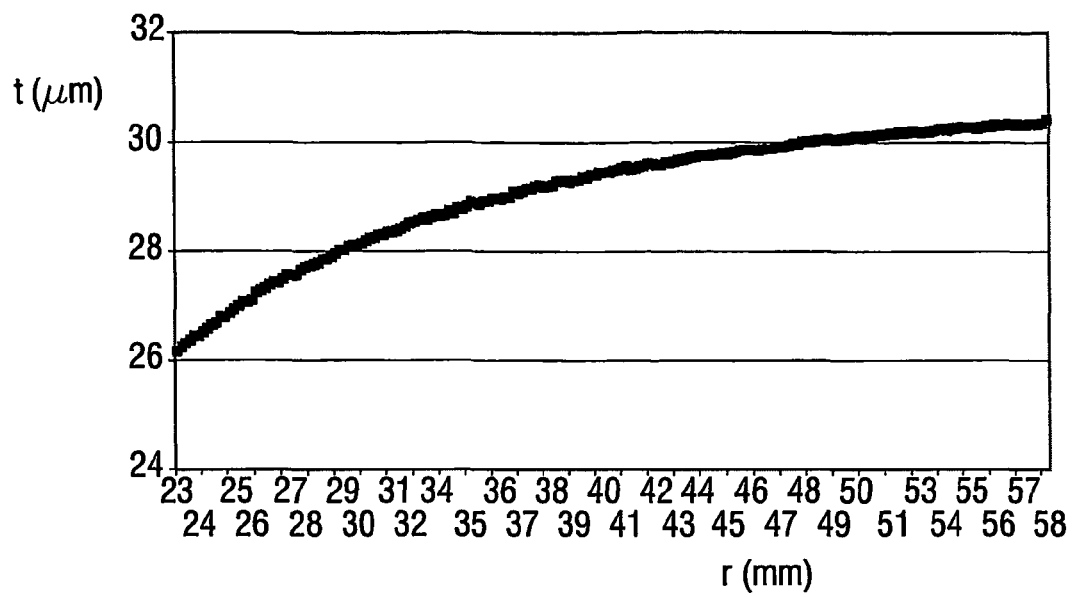
FIG. 3 shows a thickness (t) profile of a liquid layer after UV curing, applied without heating step as a function of radius (r)

More preferably the temperature rise between $r_i$ and $r_o$ has a radial temperature profile with a shape substantially resembling the shape of a radial thickness profile resulting when $\delta T_{ro}$ and $\delta T_{ri}$ would be zero, i.e. without heating. This radial thickness profile is shown in FIG. 3.

Figure 5:
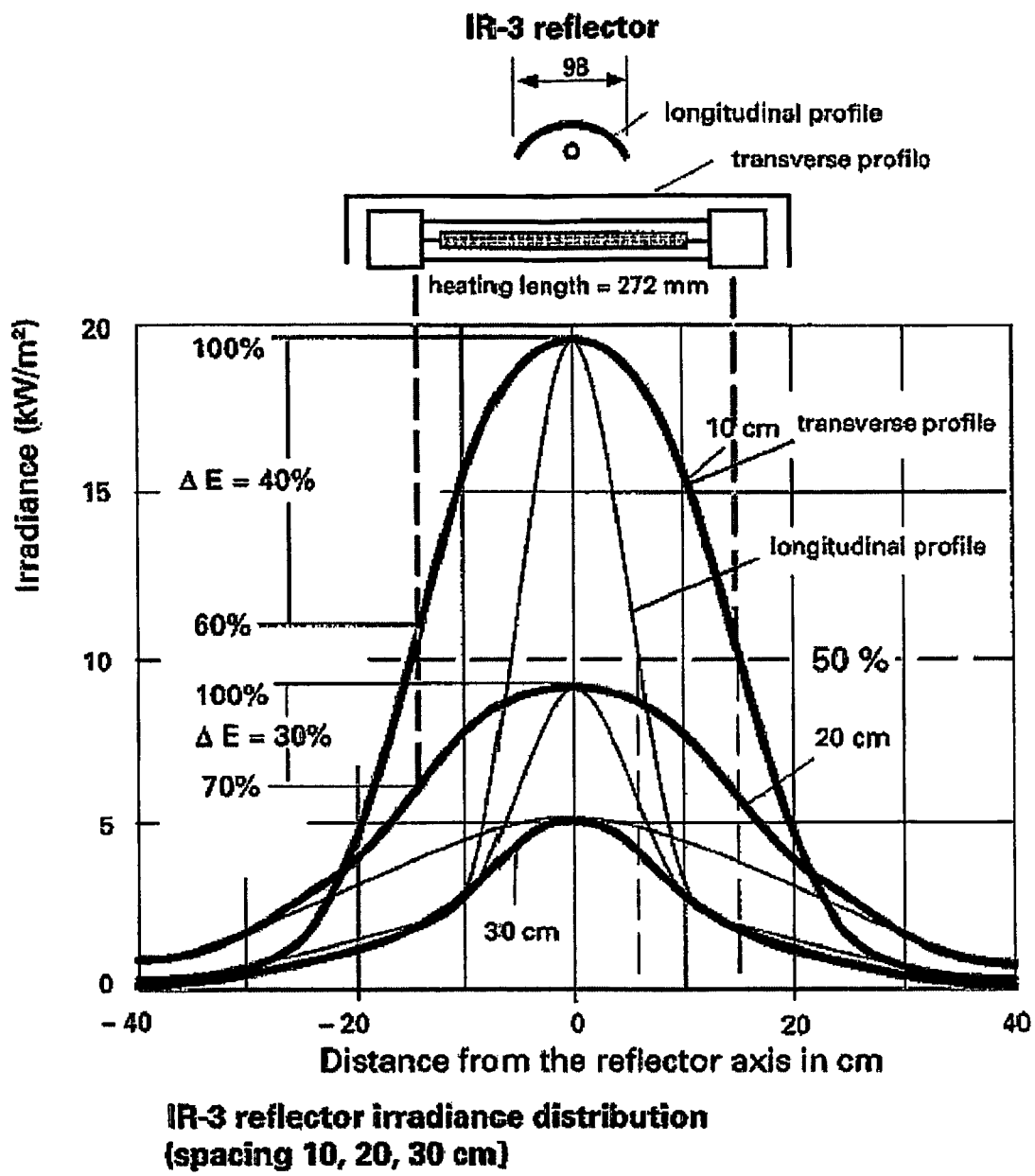
FIG. 5 shows irradiance distributions of the IR lamp used in one embodiment of the invention.

The heating means comprise an infra red heating device 14 projecting IR radiation onto the substrate 11 in an area with a radius larger than $r_i$ for causing the desired radial temperature profile in the liquid layer 12. The IR lamp 14 is a 500 W source with a heating length of 272 mm having an IR-3 reflector. Irradiance profiles are shown in FIG. 5. The optical axis of the reflector has an angle of about 45 degrees with the substrate surface as drawn in FIG. 1. The distance between edge of the reflector and the substrate is kept small, e.g. 2 mm. The edge is positioned at a radius of about 24 mm, i.e. relatively close to the inner radius $r_i$.

A radial thickness profile is achieved with a thickness of 25 μm. The variation is not more than +/−0.5 μm. In order to minimize changes in the thickness profile the rotation frequency is ramped down from 50 Hz to 13 Hz in about 2 seconds and left 10 seconds at this rotation speed in order to allow time for removing the IR heating device and placing a UV radiation source.

Subsequent pre-solidifying of the liquid 12 is performed by means of exposure to UV radiation, e.g. a high power UV source 15, e.g. Philips HP-A 400 W, with a special reflector at a height of 10 cm above the liquid 12 surface. UV radiation source 15 gives a substantially uniform radiation output. The UV exposure for pre-solidifying at the position of the liquid layer 12 of the substrate takes 2 seconds with an intensity of 50 mW/cm$^2$. The UV exposure takes place in an atmosphere containing oxygen, i.e. air, and at an exposure intensity leaving a few pm top portion of the liquid layer 12 unsolidified by means of oxygen inhibition. This top layer may be required for subsequent process steps, e.g. the embossing of information in the top surface of the liquid layer 12. A few mm wide outer peripheral zone of the substrate 11 is shielded by a mask 16 in order to prevent exposure of the liquid layer in this zone to UV radiation. After the UV exposure of the liquid 12 in the exposed portion, the substrate 11 is rotated at a rotation frequency sufficiently high, i.e. 65 Hz, to substantially remove the non exposed liquid 12b in the shape of an edge bead in the outer peripheral zone from the substrate 11. Note that in the drawing the layer thickness of the liquid layer 12 is drawn showing the situation before starting the heating method according to the invention. It must be noted that the mentioned spin coating rotation speeds and times may be adapted and that at higher rotation speeds the cycle time may be reduced substantially. In a more automated process using a higher intensity of both the IR lamp and the UV lamp even a further reduction of cycle time may be achieved. The IR and UV radiation sources may be positioned automatically, which further reduces the cycle time. The method may be fine tuned to liquids with different properties, e.g. viscosity. E.g. for DVD bonding a glue is used, made by DIC type nr SD694, having a viscosity of 350 mPas. The spin rotation speeds for this liquid must be adapted to e.g. 30 Hz and 10 Hz instead of 50 Hz and 13 Hz.

Figure 2:
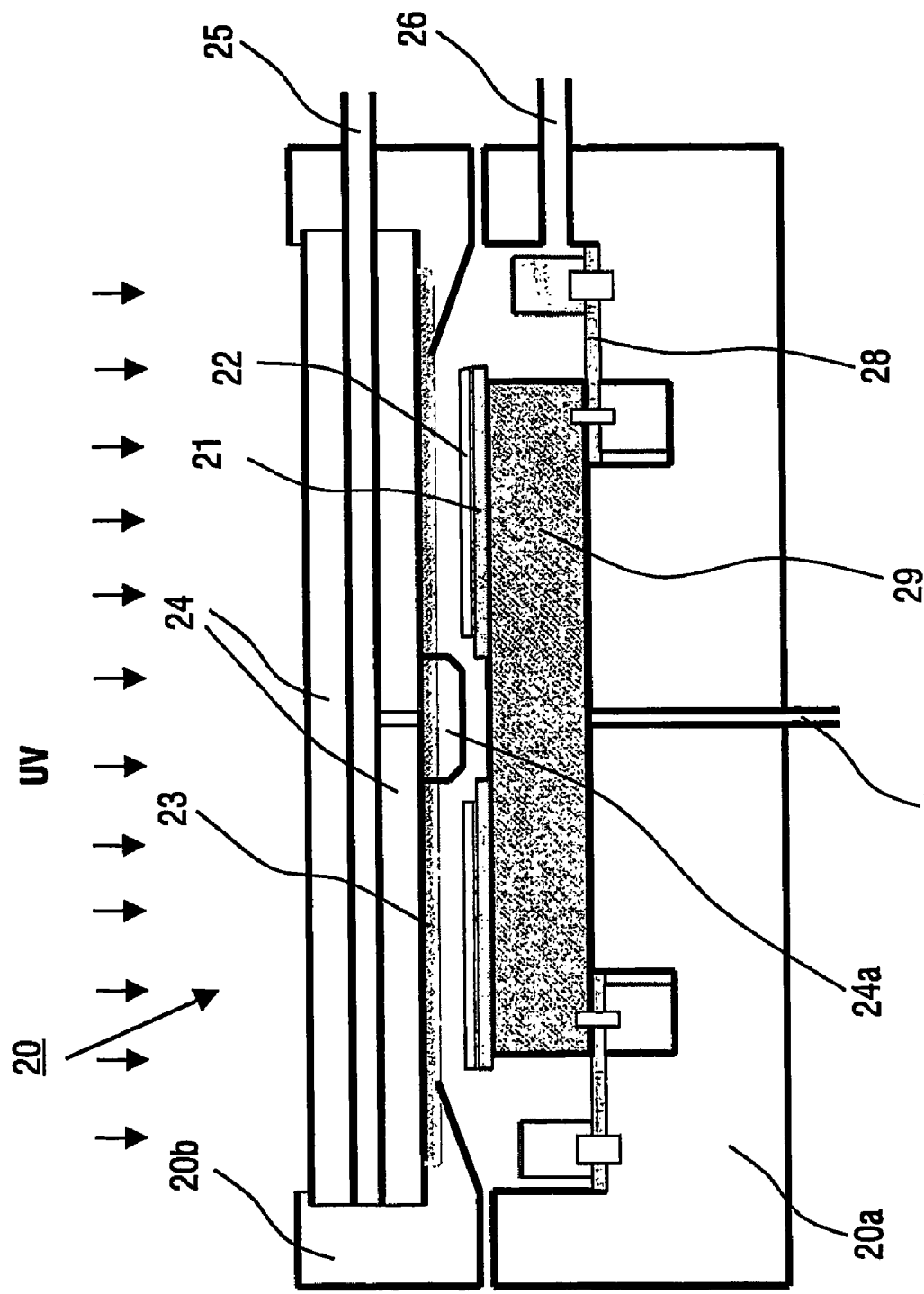
FIG. 2 shows a device in which an optical data storage medium manufactured with the method according to the invention is present and embossed with a transparent stamper.

In FIG. 2 a device 20 is shown to manufacture an optical data storage medium, e.g. containing two or more recording stacks separated by spacer layers. A stamper 23 transparent to UV radiation is pressed into the unsolidified top portion of the precured liquid layer 22 manufactured according to the method of the invention. Subsequently the top portion is solidified by exposure to UV radiation which is projected through the transparent stamper 23. The transparent stamper 23 is separated from the top portion of the completely solidified liquid layer 22. Further layers are provided separately for finalization of the optical data storage medium. Note that a non-transparent stamper, e.g. Ni, may be used in case exposure of the liquid layer 22 is performed from a side other than the side where the stamper is present.

The functioning of device 20 for manufacture of a medium will now be explained in more detail. The substrate 21, provided with a liquid layer 22 according to the method of the invention is positioned on top of a holder 29 in the bottom part 20a of the device and at the same time precentered. The holder 29 is connected to the rest of the bottom part 20a of the device by means of a rubber membrane 28. At the beginning of the process, vacuum is present under the holder 29 of the bottom part 20a The top part 20b of the device 20, holds a transparent stamper 23 which is held in position against the top part 20b by means of a vacuum outlet 25. The centering pin 24a around which the stamper 23 is centered is tapered and will center the substrate 21 with precured liquid layer 22 when parts 20 a and 20b are brought together. Air between the substrate 21 and stamper 23 is pumped out through opening 26 until a desired under-pressure level is achieved. Subsequently air is let into the bottom part 21a through opening 27, which action presses the substrate 21 with layer 22 against the stamper 23. UV radiation is sent through the transparent plates 24 and the transparent stamper 23 in a desired dose and cures the top portion of the layer 22. Air is released back into through 36 and after opening the device 20 the stamper may be separated from the substrate 21 with cured layer 22. The top surface of cured layer 22 now contains a negative copy of the relief structure of the stamper 23.

Figure 4:
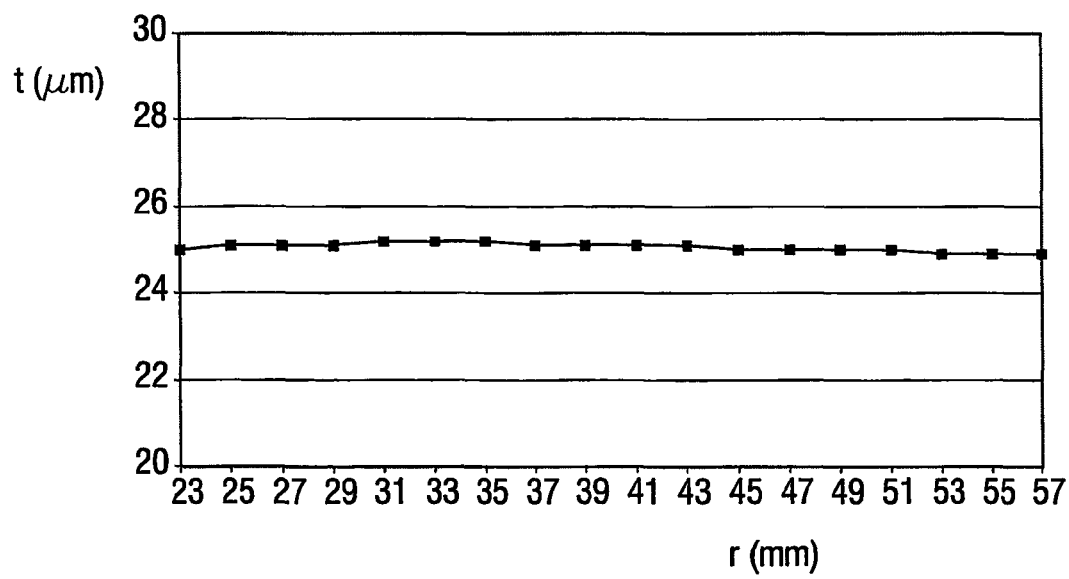
FIG. 4 shows a radial thickness profile of a liquid layer after UV curing, applied using a heating step according to the invention.

In FIG. 3 a radial (r) thickness (t) profile of the liquid layer, measured after UV curing, is shown achieved when $\delta T_{ro}$ and $\delta T_{ri}$ would be zero, i.e. when no heating step is performed. It can be seen that a substantial increase in layer thickness is present radially outward, which is far from the desired profile. However it was found that when the temperature rise between $r_i$ and $r_o$ has a radial temperature profile with a shape substantially resembling the shape of a this radial thickness profile a very flat final thickness profile can be achieved as shown in FIG. 4. resulting when $\delta T_{ro}$ and $\delta T_{ri}$ would be zero. The achieved temperature profile may be adjusted by moving the position of the heating means, e.g. the IR-lamp. A temperature measurement of the surface of the liquid layer after the heating step has been performed with an infrared camera as described with FIG. 6.

In FIG. 4 a radial thickness profile is shown achieved with the method according to the invention.

In FIG. 5 the irradiance distribution of the IR-3 reflector used for one embodiment of the invention is shown at different spacings (distances).

In FIG. 6 the measured radial temperature profile of the heated liquid layer is shown as measured with an IR camera. This measurement can only be done after switching of the IR lamp. Hence the measurement is performed a few seconds later and therefore the temperature profile is only an indication of the real temperature profile. Note that the horizontal axis (radius) is reversed.

It should be noted that the above-mentioned embodiment illustrates rather than limits the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The mere fact that certain measures are recited in mutually different dependent claims does not indicate that a combination of these measures cannot be used to advantage.

According to the invention a method of manufacturing an optical data storage medium, comprising at least one substrate and a plurality of layers deposited on the substrate is described. The medium includes at least one of a transparent spacer layer and transparent cover layer. The layer is provided by applying a liquid onto the rotating substrate and rotating the substrate further in order to spread out the liquid into a layer substantially uniformly between an inner radius $r_i$ and an outer radius $r_o$, and solidifying the liquid layer by means of exposure to UV radiation. After applying the liquid onto the rotating substrate the liquid layer is heated by heating means in such a way that the temperature rise of the liquid layer at $r_i$ has a value $\delta T_{ri}$, while the temperature rise of the liquid layer between $r_i$ and $r_o$ gradually increases, and the temperature rise of the liquid layer at $r_o$ has a value $\delta T_{ro} > \delta T_{ri}$. In this way the spacer layer or cover layer has a variation in thickness smaller than +/−1 μm, measured over the information storage area.

Further a medium manufactured using said method and an apparatus for performing the method are described.

The invention claimed is:

1. A method of manufacturing an optical data storage medium to form at least one substrate having a plurality of layers deposited on the substrate, including at least one of a transparent spacer layer and a transparent cover layer, the method comprising acts of:

applying a liquid onto the rotating substrate by rotating the substrate further in order to spread out the liquid into a layer substantially uniformly between an inner radius $r_i$ and an outer radius $r_o$, and exposing the liquid layer to UV radiation to solidify the liquid layer; and heating the liquid layer by heating means in an area with a radius larger than the inner radius $r_i$ in such a way that the temperature rise of the liquid layer at $r_i$ has a value $\delta T_{ri}$, wherein while the temperature rise of the liquid layer between $r_i$ and $r_o$ gradually increases, the temperature rise of the liquid layer at $r_o$ has a value $\delta T_{ro} > \delta T_{ri}$, and wherein the temperature rise between $r_i$ and $r_o$ has a radial temperature profile with a shape substantially resembling the shape of a radial thickness profile resulting when $\delta T_{ro}$ and $\delta T_{ri}$ are zero.

2. The method as claimed in claim 1, wherein the heating act is performed by heating means having an infra red heating device for projecting IR radiation onto the substrate in an area with a radius larger than $r_i$ for causing a desired radial temperature profile in the liquid layer.

3. The method as claimed in claim 2, wherein the heating means comprise a heated chuck on which the substrate is mounted during rotation, said chuck having a heated surface for causing a desired radial temperature profile in the liquid layer.

4. The method as claimed in claim 1, wherein the heating means comprise a directed flow of heated gas emanating from a nozzle for causing a desired radial temperature profile in the liquid layer.

5. The method as claimed in claim 1, wherein a few mm wide outer peripheral zone of the substrate is shielded by a mask in order to prevent exposure of the liquid layer in this zone to UV radiation.

6. The method as claimed in claim 5, wherein after the exposure of the liquid layer in the exposed portion, the substrate is rotated at a higher rotation frequency than previously applied that is sufficiently high to substantially remove the non exposed liquid in the outer peripheral zone from the substrate.

7. The method as claimed in claim 1, wherein the act of exposing is performed in an atmosphere containing oxygen and at an exposure intensity, the act of exposing further comprises an act of inhibiting oxygen for leaving a top portion of the liquid layer unsolidified.

8. The method as claimed in claim 1, wherein a thickness of the liquid following the heating of the liquid varies over an entire surface of the optical data storage medium in a range of +/−1.0 μm.

9. The method as claimed in claim 1, wherein a thickness of the liquid following the heating of the liquid varies over an entire surface of the optical data storage medium in a range of +/−0.5 μm.

10. The method as claimed in claim 1, wherein a thickness of the liquid following the heating of the liquid varies over an entire surface of the optical data storage medium in a range of +/−0.2 μm.

* * * * *